United States Patent [19]

Meckler

[11] Patent Number: 4,490,981

[45] Date of Patent: Jan. 1, 1985

[54] FIXED SOLAR CONCENTRATOR-COLLECTOR-SATELITE RECEIVER AND CO-GENERATOR

[76] Inventor: Milton Meckler, 16348 Tupper St., Sepulveda, Calif. 92343

[21] Appl. No.: 427,736

[22] Filed: Sep. 29, 1982

[51] Int. Cl.³ .................................................. F03G 7/02
[52] U.S. Cl. ..................... 60/641.15; 60/698; 126/425; 350/3.73
[58] Field of Search ............................ 60/641.15, 698; 126/425; 350/3.70, 3.72, 3.73, 3.78

[56] References Cited

U.S. PATENT DOCUMENTS 4,002,031  1/1977  Bell .................................... 60/641.15
4,354,117  10/1982  Abernathy ......................... 60/641.15

Primary Examiner—Allen M. Ostrager
Attorney, Agent, or Firm—William H. Maxwell

[57] ABSTRACT

An insolation and micro wave receiver fixedly installed in alignment with the suns azimuth and within the look angle of a satellite, and comprised of holographic windows recorded according to time related to the suns position as zone plates to concentrate infrared light into a Rankine cycle power generating receiver and to columnate ultraviolet light onto a photo voltaic power generating plane, utilizing a micro wave dish as the substrate support of photo voltaic cells and as a condenser of the Rankine cycle operating an induction generator synchronous with an external alternating current power system, and with the photo voltaic power synchronized therewith by commutation.

18 Claims, 6 Drawing Figures

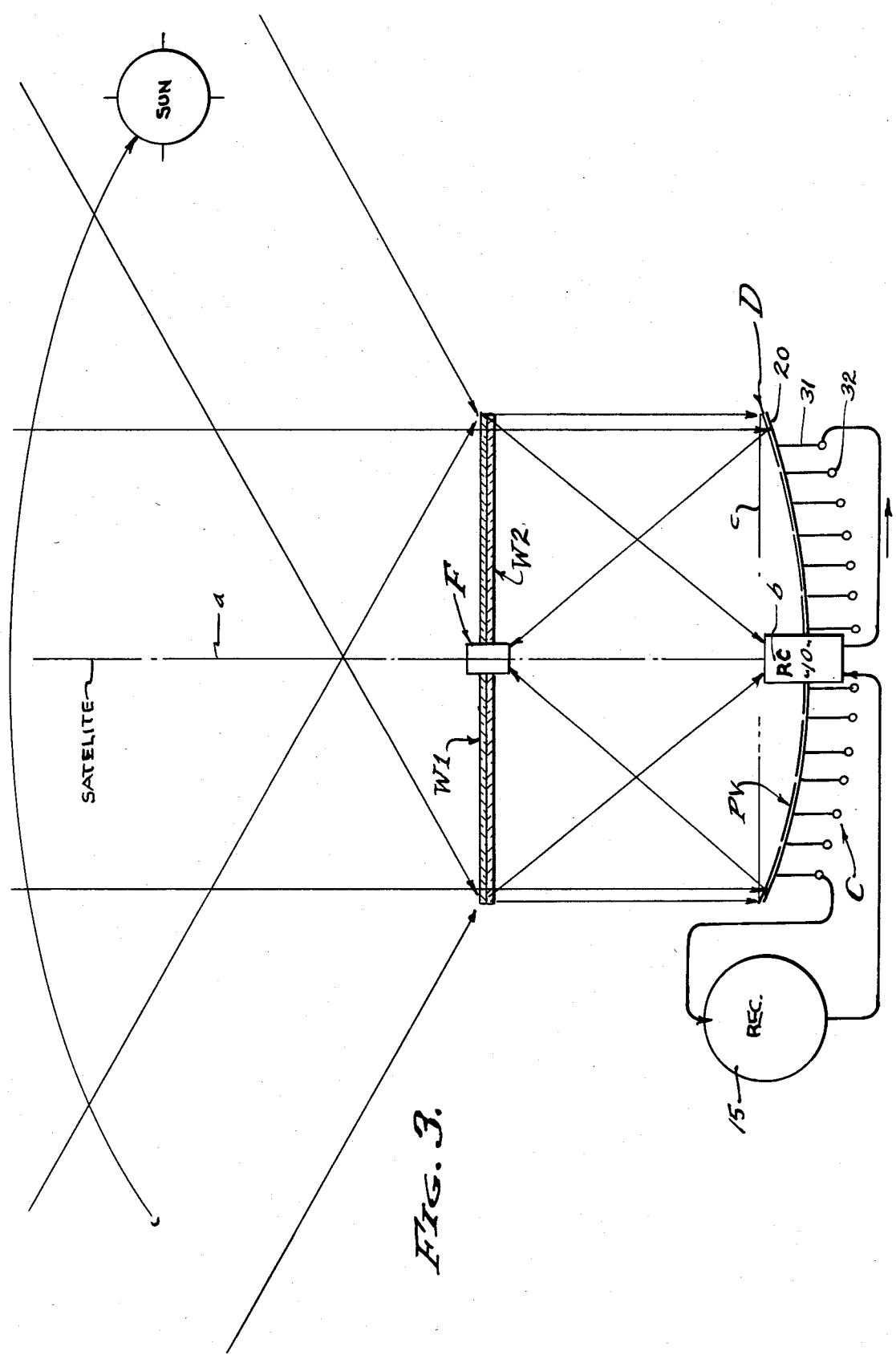

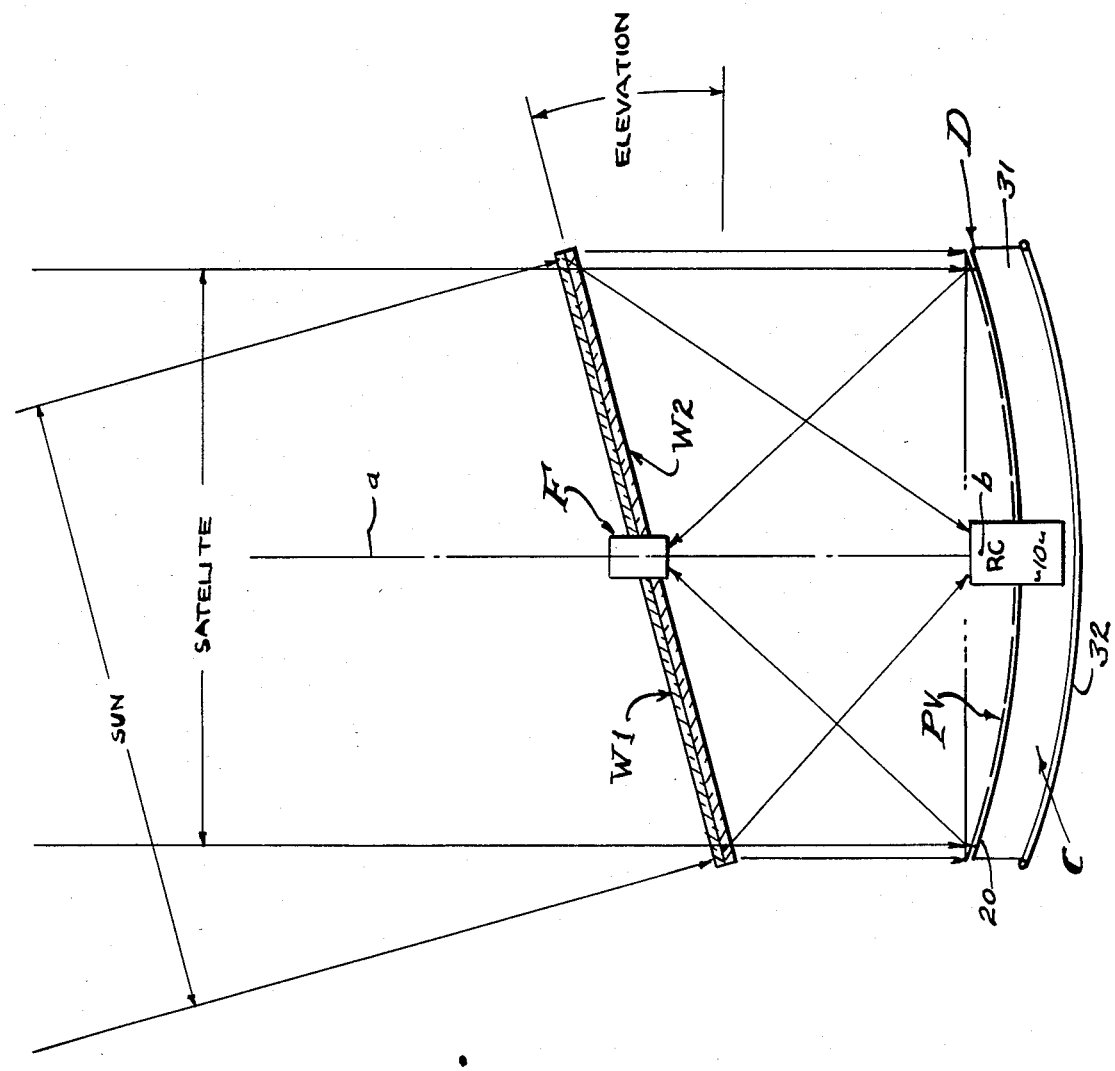

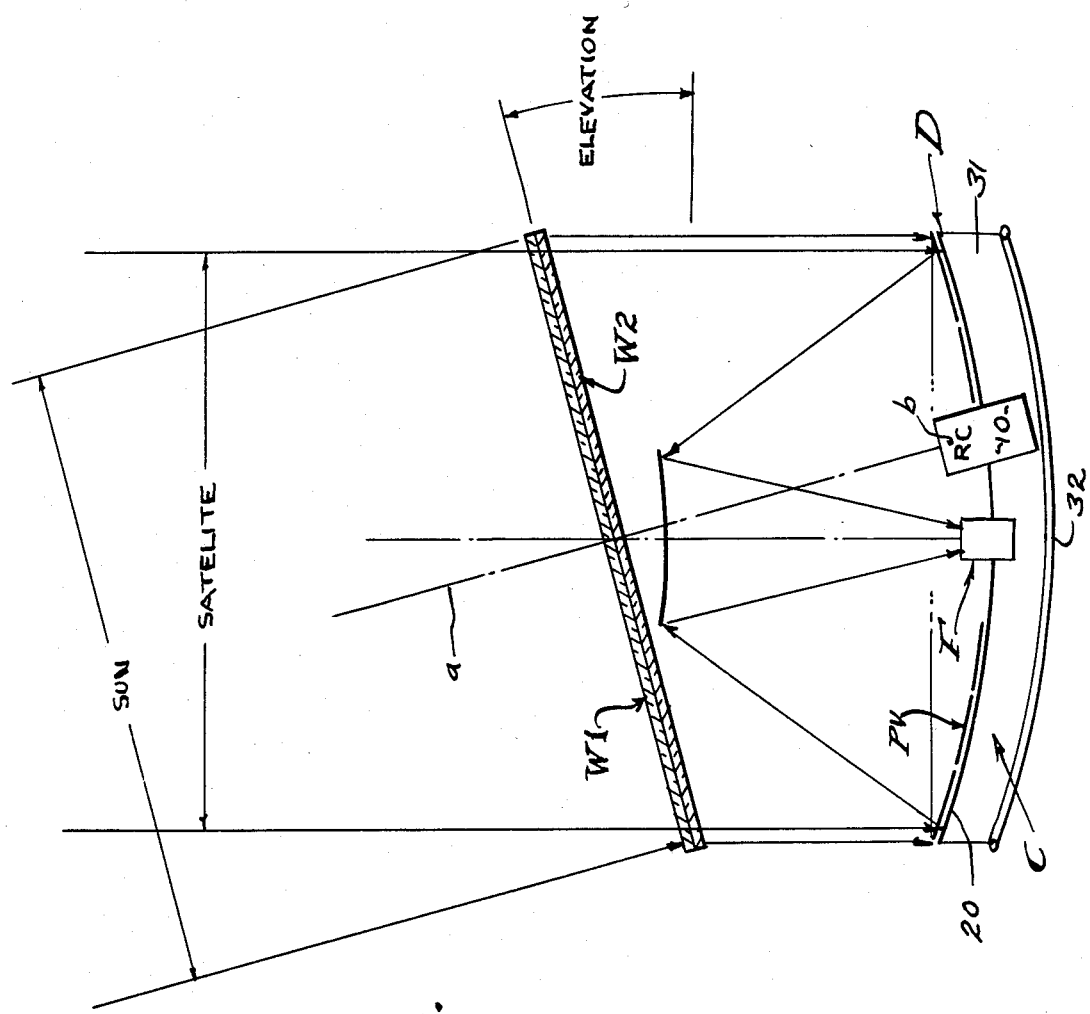

FIXED SOLAR CONCENTRATOR-COLLECTOR-SATELITE RECEIVER AND CO-GENERATOR

BACKGROUND

Holography is a method by which the wave field of light is recorded as an interference pattern, sometimes called a lensless system since the usual lens required in optics is replaced by a film having zone plates that diffract and thereby focus the light. The process of interference is involved wherein wave length and phase establish "constructive interference" that increases amplitude, and "destructive interference" that decreases amplitude. The interference effect normally requires that the light be coherent; coherent light being monochromatic (having a single wave length) that maintains the form of its phase fronts. That is, successive wave fronts, as they pass a given location, all have the same shape. Therefore, laser light is a most appropriate source of coherent light, to be used in producing holograms for the purpose herein disclosed. The technique of "off-axis holography", produced with a reference beam of light introduced obliquely with respect to the subject beam of light, enables the straight-through or unaffected light to be separated, since the various waves travel in different directions.

The significant holographic feature employed herein is the "volume hologram" in which the thickness of the film or recording medium accommodates a multiplicity of "zone plates" in the form of interference patterns embedded within the thickness of the film or recording medium and each passing a descrete frequency of light. Diffraction from volume holograms is orientation sensitive, whereby many sets of wave patterns can be recorded in a single volume hologram, each with the recording material having a slightly different orientation. When the hologram is subject to the passage of light, only one set of waves at a time can have the proper orientation to produce a diffracted wave. When the light source is rotated slightly with respect to the plane of the film, the one diffracted wave is extinguished and another diffracted wave appears. Thus, the hologram exhibits wavelength selectivity. For light incident on the hologram at a given angle, the diffracted light is formed only for the light of proper wavelength, the wave length selectivity being greatest when the subject and reference beams are introduced from opposite sides of the film, this type of hologram being known as the "white light hologram" because it diffracts white light from a source. This type of hologram selects only a narrow band of light out of the wide band of wave lengths that comprise white light, this narrow band of light being diffracted by the hologram. The remaining light passes through the hologram without diffraction. The volume recording medium can be a photographic emulsion of moderately great thickness, or a number of layers of light sensitive material that can be darkened by exposure to coherent light, for recording to establish interference patterns.

Diffraction is an important phenomenon in holography, a grating employed at the zone plates whereby light is deflected, and herein to have a variable lens function. Accordingly, different gratings of zone plates are established by laser photography or the like, whereby permanent holograms are established in one or more zone plates as multiple slit gratings. In the photographic recording of holograms, the change from transparent to opaque areas is gradual rather than sudden and this causes the light amplitude to vary gradually This sinuous variation in light amplitude has its advantageous effect in diffraction analogous to refraction in a solid transparent lens or the like. In holography, the light passes around opaque objects (diffraction) rather than through a substance (refraction), but nevertheless the direction of certain light waves is altered. In holography, the interference pattern generated by sets of light waves is three dimensional in extent, and when such a pattern is recorded as by photography, it does not merely exist at the surface of an emulsion or film, but establishes itself in plates throughout the volume or thickness of said emulsion or film. Therefore, photographically produced gratings or zone plates of holograms are considered as recorded wave interference patterns through which multi-color light behaves according to wavelength. A zone plate can be described as a set of flat, parallel lines or concentric annular rings which diffract light waves so that they are columnated or so that add constructively at a desired focal point, preventing the passage of light waves that would interfere destructively at that point. The emulsion of a photographic plate or film may be many, perhaps twenty, or more, light wavelengths in thickness, so that three dimensional patterns can be established as distinctively effective zone plates.

It is an object of this invention to achieve the insolation of solar energy through the use of a fixed diffraction panel or panels in combination with a reflector dish which serves as a microwave receiver or transmitter. Heretofore, simple solar panels have been fixed to face skyward toward the suns traverse, and more sophisticated concentrators have been focused at the sun throughout its traverse by means of tracking devices. The efficiency of the fixed solar panels is wanting, while the complexity of tracking systems involves considerable expense in the initial construction and in the continued operation thereof. Therefore, a fixed installation devoid of tracking mechanisms is to be desired, this being the primary object of this invention.

This invention is characterized by fixedly positioned collector and concentrator holograms that have diffraction capability inherent in a holographic window to direct sunlight along the collector axis. Holography involves interference patterns between two or more sets of light waves, and by which films or laminates are formed with certain gratings that will selectively function as lenses that focus certain wavelengths of light. Accordingly, films with distinctive gratings will have varied and predetermined focusing characteristics, established photographically as zone plates and each adapted to redirect and focus light waves of a certain wavelength. The angle of redirection or diffraction can be great, so that sunlight at a low angle of incidence can be redirected as light moves through the hologram grating which then focuses those waves by means of diffraction, similar to lens refraction, to emanate substantially normal therefrom or within a prescribed angle thereto. In practice, a multiplicity of hologram zone plates are established in layers and together establish distinctive grating zones acting together to focus sunlight with diminishing effect from a low angle of incidence to a high angle of incidence or to the Zenith, and so that light wave transmission through the holographic laminate emanates substantially normal therefrom at all times of day between shortly after sunrise and shortly before sunset. This primary diffraction of the incoming sunlight will be referred to herein as "normalizing" the light, a redirecting of incoming white light into selected wavelength light projected in an alignment substantially parallel to the axis of the collector. The holograms are preferably planar as shown herein, as distinguished from the reflector dish for micro wave transmission.

All sunlight is received as white light that passes selectively through holographic laminates or plates, the infrared (IR) wave portion of the spectrum being separated for heat absorption, and the ultraviolet (UV) portion of the spectrum being separated for photo voltaic power generation. It is an object of this invention to receive white solar light and to separate it into distinct wavelength ranges while normalizing its projection to occur parallel with the axis of the collector. In accordance with this invention, spectrally selective holograms comprised of circularly concentric gratings are provided to separate the infrared portion of the spectrum from the ultraviolet portion of the spectrum while normalizing the same along the collector axis. In practice, the infrared portion is concentrated and the ultraviolet portion is columnated, there being hologram gratings for infrared light diffraction and a hologram gratings for ultraviolet light diffraction. The range of wavelength diffraction can be established within practical limits as circumstances require.

It is another object of this invention to project the normalized incoming light separately as infrared and ultraviolet light into a heat absorption receiver of a power generator and onto a photo voltaic power generator, respectively. Accordingly, there is a first spectrally focusing hologram comprised of circular gratings having a focal plane for concentrating infrared heat rays, and there is a second columnating hologram that projects said ultraviolet light onto a photo voltaic power generator plane at or surrounding the said concentration of infrared light. A feature of this invention is that the infrared light diffracted by an overlying hologram unaffectedly passes through an underlying hologram that separately diffracts ultraviolet light, or vice versa, the one light passing unaffectedly through the overlying hologram to be diffracted by the underlying hologram. Diffracted light in both instances is normalized and projected along or parallel to the collector axis. It is an object of this invention to advantageously employ a Rankine cycle power generator, a gas turbine or the like, at said focal plane of infrared light, and to advantageously employ photo voltaic cells at said plane thereof surrounding said power generator. It is also an object of this invention to superimpose photo voltaic cells upon a substrate in the form of a micro wave reflector, the holograms and photo voltaic cells having little or no adverse effect upon micro wave reception.

It is still another object of this invention to combine a solar collector (UV) and concentrator (IR) with a micro wave dish that simultaneously serves in the capacity of a satelite receiver and Rankine cycle condenser. A feature of this invention is that micro waves penetrate the hologram plates without being adversely affected, and also penetrates the lattice of the photo voltaic cells. As shown, the substrate and structural support for the micro wave dish is finned for heat radiation from a condenser coil of the Rankine system. The micro wave dish focuses at a feed assembly removed from the concentration of infrared light.

It is a general object of this invention to provide for co-generation of electricity whereby Rankine cycle power and photo voltaic power are combined and synchronized with an alternating power source that is external. In practice, the Rankine cycle power generator is of the induction type with the photo voltaic power generation commutated therewith as synchronized alternating current, the combination of the two being synchronous with the external alternating electrical power source by virtue of the induction type generator used herein.

The foregoing and various other objects and features of this invention will be apparent and fully understood from the following detailed description of the typical preferred forms and applications thereof, throughout which description reference is made to the accompanying drawings.

THE DRAWINGS

FIG. 3 is a diagramatic view of the fixed concentrator and collector and satelite receiver for co-generation, showing the normalization of light onto a coolector axis substantially coincidental with the look angle of a micro wave dish combined therewith.

FIG. 4 is a view similar to FIG. 3, showing a fixed installation wherein the elevation angle of the suns traverse is angularly disposed to the look angle of satelite reception.

FIG. 4a is a view similar to FIG. 4, showing a reflected micro wave and offset focus the infrared light range into a Rankine cycle receiver.

PREFERRED EMBODIMENT

Figure 1:
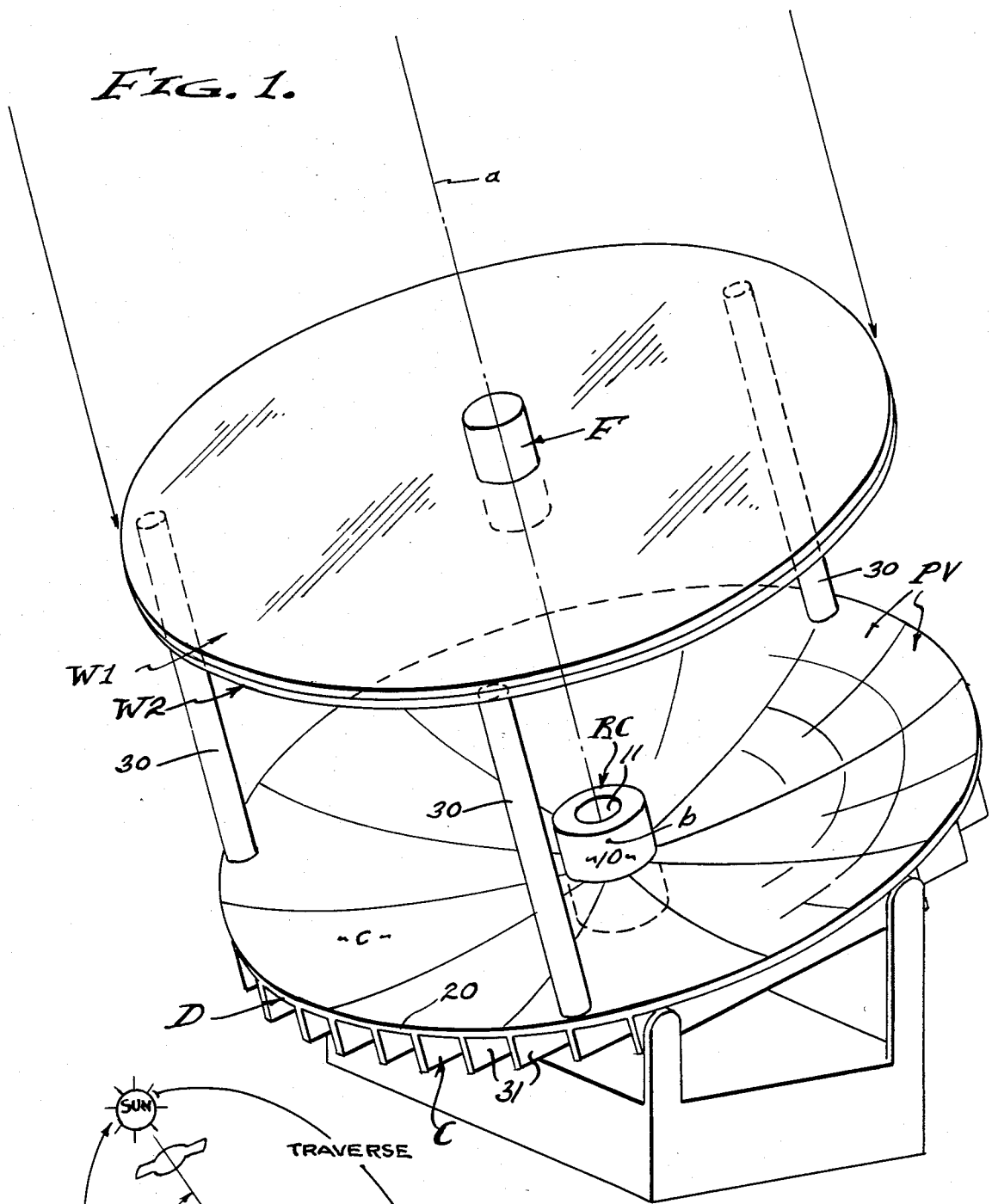
FIG. 1 is a perspective view of the concentrator-collector-satelite receiver and co-generation system embodied as a unit.
Figure 2:
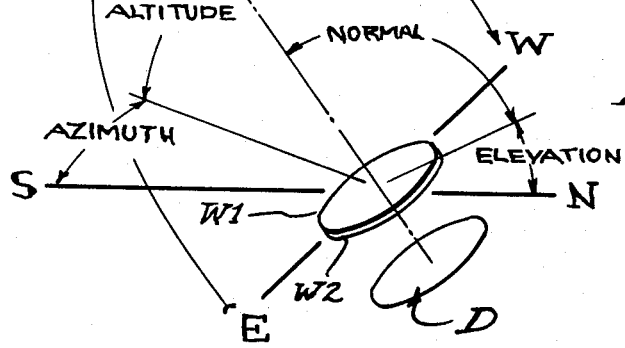
FIG. 2 is a diagramatic perspective view illustrating the altitude, azimuth and traverse relationship of the sun to the apparatus of the present invention.
Figure 5:
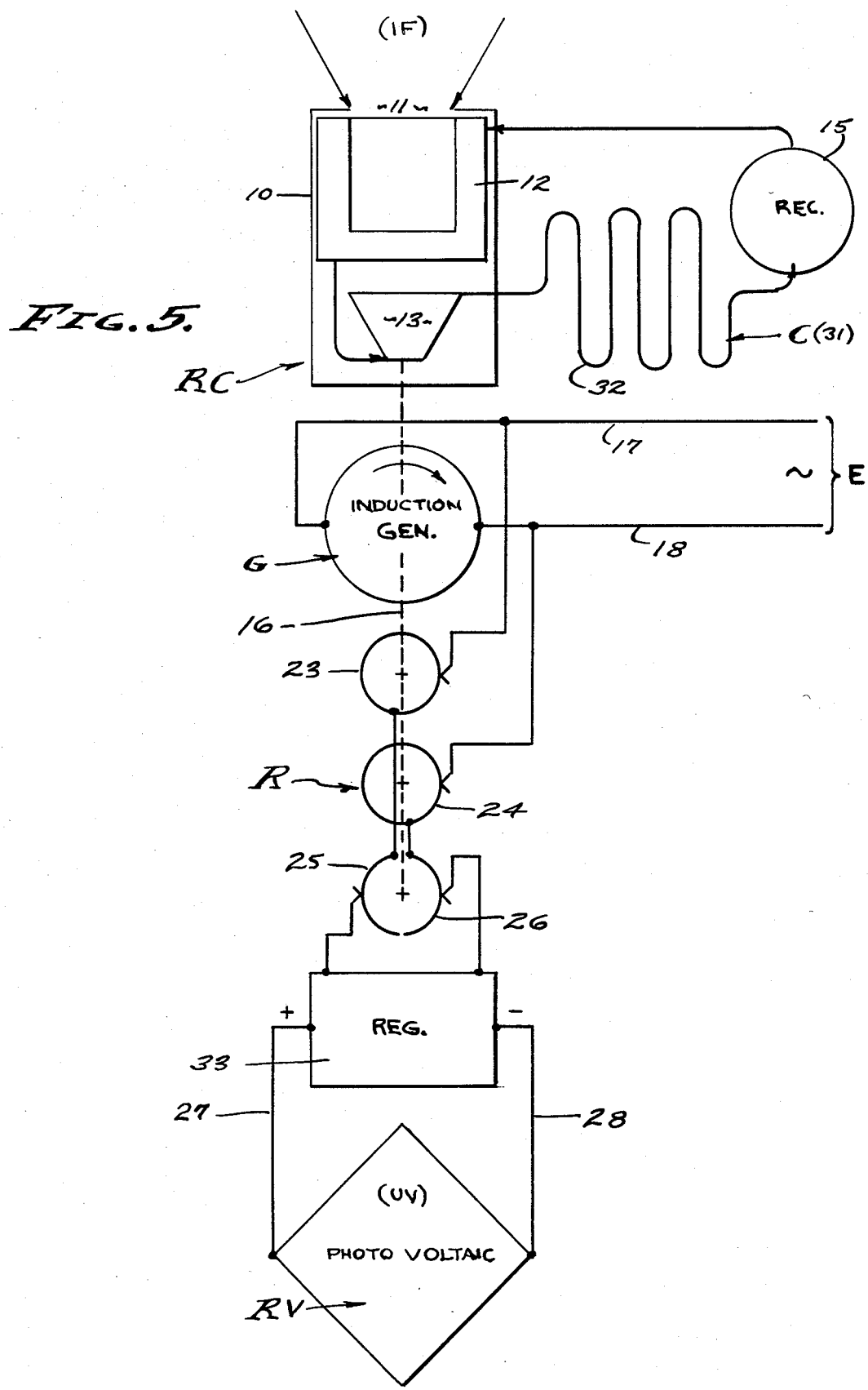
FIG. 5 is a schematic diagram of this co-generation system employing synchronized photo voltaic and Rankine cycle electrical power generation by induction generator and commutation into an external power system.

Referring now to the drawings, this invention relates to insolation and micro wave reception, combined to share common parts and elements in a unified apparatus fixedly positioned with respect to the suns traverse across the sky. The position of the sun as defined by its respective altitude and azimuth angles depends upon the longitude position of the site, and varies accroding to time of day, and according to the time of year. FIG. 2 of the drawings illustrates the traverse of the sun as it is related to altitude and azimust. However, the position of a micro wave transmitting satelite is essentially fixed with respect to a geographic position, thereby presenting what is referred to as a "look angle", so that micro wave antennas are so designed to have a "window" of view affording a margin of aim. Therefore, and as shown in FIG. 3, with a reception axis a at the elevation angle of the suns traverse and within the micro wave look angle, and fixed generally South in the Northern hemisphere, the holographic windows receive the changing altitude of sunlight and normalize its projection at selected wavelengths so as to emanate along and substantially parallel to the axis a of the apparatus. As shown in FIG. 4 the elevation angle of the suns traverse in angular with respect to the satelite look angle, in which case the planes of the holographic windows are angularly disposed accordingly with respect to the axis a aligned with the satelite look angle, and recorded for infrared and ultraviolet light projection according to that angle.

The insolation and micro wave receiver of the present invention involves generally, one or more and preferably two superimposed hologram windows W1 and W2 that redirect the passing sunlight so that it is normalized and projected toward the infrared range and toward the ultraviolet range respectively, a heat absorbing power generator means RC at the vertex of infrared concentration, a plurality of photo voltaic power generating cells PV at a collector plane surrounding the concentration of infrared light, a micro wave dish D aligned with the window axis a and in the form of a substrate support carrying the voltaic cells PV, micro wave feed means F on said axis and removed from the focus vertex of the focusing holographic window W1, a finned condenser C integral with the substrate support of the micro wave dish and in circuit with the power generator means RC, and commutation rectifyer means R coupling the power generator means RC and photo voltaic power generating means PV with an external alternating current electrical power system E.

The first concentrating hologram window W1 focuses the light range toward infrared onto a focal plane with concentration thereof spaced below said window and on the axis a. The window W1 is a planar element transparent to sunlight and in FIG. 2 is disposed normal to the axis a of the unit apparatus. In FIG. 4 window W1 is angularly disposed with respect to axis a and aligned with a sun elevation angle away from the satelite look angle. More particularly, the window W1 is a hologram comprised of a multiplicity of zone plate means as above described and recorded in a photosensitive film medium and fixed to concentrate and focus infrared light to a focal point b. It is to be understood that the focal point b can be off-axis; other than on the axis a; and that there can be a plurality of such focal points. In accordance with this invention, a plurality of holographic recordings are made within the medium layers of window W1 for different times of day. For example, eight hours of daylight divided into ten minute periods produces forty eight time segments, and for each of which a hologram is recorded in the window W1 to concentrate the infrared range of light at the focal point b when the sun is positioned according to that time position interval or segment. Because of the sinuous nature of holographic gratings, the exposure of sunlight focused at point b during each time position segment is gradual. That is, as the sun progresses from one time position segment to the next, the transmission of infrared light onto axis a and focused at point b is gradually increased and decreased. Accordingly, the function of the holographic time position segment recordings are overlapped as required, so as to create a substantially uniform and continuous illumination at point b.

The second columnating hologram window W2 straightens the ultraviolet light range onto a collector plane c spaced below said window and centered on the axis a. As shown, the plane c is at and surrounds the focal point b of window W1, and one window W1 is superimposed upon the other window W2. The window W2 is a planar element transparent to sunlight and in FIG. 2 is disposed normal to the axis a of the unit apparatus. In FIG. 4 window W2 is angularly disposed with respect to axis a and aligned with a sun angle away from the satelite look angle. More particularly, the window W2 is a hologram comprised of a multiplicity of zone plate means as above described and recorded in a photosensitive film medium and fixed to columnate the ultraviolet light range onto the collector plane c. In accordance with this invention, a plurality of holographic recordings are made within the medium layers of window W2 for different times of day. For example, eight hours of daylight divided into ten minute periods produces forty eight time segments, and for each of which a hologram is recorded in the window W2 to columnate ultraviolet range of light at the collector plane c when the sun is positioned according to that time position interval or segment. Because of the sinuous nature of holographic gratings, the exposure of sunlight columnated onto plane c during each time position segment is gradual. That is, as the sun progresses from one altitude time position segment to the next, the transmission of ultraviolet light onto plane c is gradually increased and decreased. Accordingly, the function of the holographic time position segment recordings are overlapped as required, so as to create a substantially uniform and continuous illumination at plane c.

The heat absorbing power generator means RC is provided to absorb the heat of insolation at the focal point b of the window W1. A Rankine cycle power means is shown, comprised of a receiver 10 with an opening 11 for the reception of concentrated infrared light along axis a, a boiler 12, a turbine 13, a condenser C, and a receiver 15; there being a working fluid that is converted from liquid to gas (an organic fluid, freon, steam or the like) during operation of the power cycle. Included but not shown, there are the usual flow controls, injector pump, and speed governor etc., all according to the state of the art. Generally shown is the fluid circuit of liquid-gas working fluid from the turbine 13, through the condenser C and into the receiver 15 for subsequent injection into the boiler 12. The power output of the turbine 13 is a shaft 16 that operates an electrical generator G of the induction type to operate synchronously with an external source E of alternating current electrical power, for example domestic power at 60 Hertz through power lines 17 and 18, single phase being shown.

The light sensitive photo voltaic cells PV are provided to absorb light energy at the collector plane c beneath the window W2 and surrounding the power generator means RC above described. The photo voltaic cells can vary in configuration and in construction and materials, according to the state of the art. However, those cells which are most responsive to the ultraviolet light range are employed herein and supported upon a substrate 20 that forms the reflective surface of the micro wave dish D, as will be described. In practice, there is a battery of photo voltaic cells PV arranged in parallel and/or in series as circumstances require in order to produce the voltage required. As shown, there are direct current output lines 27 and 28 emanating from the battery of photo voltaic cells PV, protected by voltage regulator means 33, and delivering direct current voltage that is synchronously commutated as next described.

In accordance with this invention, the direct current output of the photo voltaic cells PV is synchronized by commutation rectifier means R with the output of the induction generator G, and A.C. generator, which is inherently synchronized with the external line power E to which it is operationally responsive. Commutation can be by solid state means responsive to polarity changes in the line power E, and such as to rectify the PV output into corresponding polarity cycles. As shown, commutation is mechanical and involves positive and negative commutator bars 25 and 26 operated by shaft 16, and slip rings 23 and 24 of alternating polarity connected into the aforesaid power lines 17 and 18, in synchronized polarity and in phase with the alternating power line current.

In accordance with this invention, the micro wave dish D underlies the battery of photo voltaic cells PV and forms the supporting substrate therefor. Accordingly, the dish D is concaved and of parabolic configuration with a reflective surface that focuses micro waves onto axis a between the collector plane c and the planes of windows W1 and W2, and preferably at the planes of said windows. As shown, the micro wave receiver or feed means F is disposed and supported within a central opening through said windows, and the windows are supported by struts or trusses 30 from the perimeter of the micro wave dish D. The angular disposition of windows W1 and W2 to the axis a is according to any divergence between the sun traverse altitude angle and the satelite look angle. The micro wave receiver circuitry is not shown, and is installed according to the state of the art.

In accordance with this invention, the substrate support for the photo voltaic cells is a heat absorptive reflective surface that protects the PV cells from overheating, and simultaneously functions as a condenser C in the Rankine cycle power circuit RC. As shown, the structural shape of the parabolic dish D is maintained by means of deep heat radiating ribs or fins 31 that depend from the lower face of the dish D and through which working fluid coils 32 extend for the dissipation of heat. The coils 32 are embedded or attached to the ribs 31 remote from the substrate 20, so that the Rankine cycle discharge of heat does not adversely affect the PV cells, and so that the flow of heat into the ribs is from both sources, the substrate and the coils.

From the foregoing it will be seen that the fixed insolation apparatus of the present invention is effective in its ability to collect and concentrate sunlight during predetermined time position segments of the day, to concentrate infrared light into the receiver of the power generating means, and to columnate ultraviolet light onto a photovoltaic collector plane. The operational axis of the apparatus is fixed to a satelite "look angle" and the disposition of the holographic windows fixed to the angular elevation of the suns traverse. Accordingly, it is then feasible to record holograms within the window mediums to focus and to columnate selected wave lengths of light along the axis of the apparatus, and to a focal point, and onto a collector plane by means of state of the art holography recordings. The azimuth and altitude adjustments for normalizing light along the operational axis will vary dependent upon the site of installation and time segment resolution desired.

Having described only the typical preferred form and application of my invention, I do not wish to be limited or restricted to the specific details herein set forth, but wish to reserve to myself any modifications or variations that may appear to those skilled in the art as set forth within the limits of the following claims.

I claim:

1. A fixed position solar concentrator and power generator, including in combination;

a planar hologram window comprised of a transparent medium having a thickness accomodating a multiplicity of zone plate means and each recorded therein for the reception of and passage of a descrete wavelength of sunlight during a time position interval of the suns traverse and each concentrating said descrete wavelength of sunlight by diffraction along a common axis to a focal point, and a heat absorbing power generator means to absorb the heat of insolation at the focal point and received successively from the multiplicity of concentrating holographic zone plate means as the suns time position intervals successively change during its traverse.

2. The fixed position solar concentrator and power generator as set forth in claim 1, wherein the descrete wavelengths of sunlight diffracted are those toward the infrared.

3. The fixed position solar concentrator and power generator as set forth in claim 1, wherein the heat absorbing power generating means operates on the Rankine cycle with a receiver at the focal point concentrating the heat of insolation into a boiler to pressurize a working fluid for power generation.

4. A fixed position solar collector and power generator, including in combination;

a planar hologram window comprised of a transparent medium having a thickness accomodating a multiplicity of zone plate means and each recorded therein for the reception and passage of a descrete wavelength of sunlight during a time position interval of the suns traverse and each columnating said descrete wavelengths of sunlight by diffraction onto a collector plane, and a light sensitive power generator means to absorb light energy at the collector plane and received successively from the multiplicity of holographic zone plate means as the suns time position intervals successively change during traverse.

5. The fixed position solar collector and power generator as set forth in claim 4, wherein the descrete wavelengths of sunlight diffracted are those toward the ultraviolet.

6. The fixed position solar collector and power generator as set forth in claim 4, wherein the light sensitive power generating means is a battery of voltaic cells occupying the collector plane for power generation.

7. A fixed position solar concentrator-collector and co-generating power generator, including in combination;

first and second concentrating and columnating hologram windows and one disposed coextensively over the other, the first concentrating hologram window being comprised of a transparent medium having a thickness accomodating a multiplicity of zone plate means and each recorded therein for the reception of and diffraction therethrough of descrete wavelengths of sulight toward the infrared, the second columnating hologram being comprised of a transparent medium having a thickness accomodating a multiplicity of Zone palte means and each recorded therein for the reception of an diffraction therethrough of descrete wavelengths of sunlight toward the ultraviolet, each recorded zone plate means being receptive to said distinctive wavelengths of sunlight during a time position interval of the suns traverse and directing descrete wavelengths of sunlight by diffraction along a common axis to a focal point of the first mentioned concentrating hologram window and coextensively onto the collector plane of the second mentioned columnating hologram window, a heat absorbing power generating means to absorb the heat of insolation at the focal point and received successively from the multiplicity of concentrating holographic zone plate means, and a light sensitive power generating means to absorb light energy at the collector plane and received successively from the multiplicity of columnating hologram zone plate means.

8. The fixed position solar concentrator-collector and co-generating power generator as set forth in claim 7, wherein the heat absorbing power generating means includes and drives an alternating current generator, and wherein the light sensitive power generating means includes a battery of photo voltaic cells with commutator means rectifying direct current into alternating current synchronized with the alternating current generator.

9. The fixed position solar concentrator-collector and co-generating power generator as set forth in claim 7, wherein the heat absorbing power generating means includes and drives an alternating current induction generator synchronous with an external alternating current power system, and wherein the light sensitive power generating means includes a battery of photo voltaic cells with commutator means rectifying direct current into alternating current synchronized with the alternating current generator and said external system.

10. The fixed position solar concentrator-collector and co-generating power generator, as set forth in claim 7, wherein the heat absorbing power generating means includes and drives an alternating current generator, and wherein the light sensitive power generating means includes a battery of photo voltaic cells with a communtator means operated by a shaft of the alternating current generator and rectifying direct current into alternating current synchronized with the alternating current generator.

11. The fixed position solar concentrator-collector and co-generating power generator as set forth in claim 7, wherein the heat absorbing power generating means includes and drives an alternating current induction generator synchronous with an external alternating current power system, and wherein the light sensitive power generating means includes a battery of photo voltaic cells with a commutator means operated by a shaft of the alternating current induction generator and rectifying direct current into alternating current synchronized with the alternating current induction generator and said external system.

12. The fixed position solar concentrator-collector and co-generating power generator as set forth in claim 7, wherein the light sensitive power generating means is a battery of photo voltaic cells carried by a substrate at the collector plane for power generation, wherein the heat absorbing power generating means operates on the Rankine cycle with a receiver at the focal point concentrating the heat of insolation into a boiler to pressurize a working fluid for power generation, and wherein the said substrate carries heat radiating coils transporting expended working fluid to be cooled for recycling to said boiler.

13. The fixed position solar concentrator-collector and co-generating power generator as set forth in claim 7, wherein the light sensitive power generating means is a battery of photo voltaic cells carried by a substrate at the collector plane for power generation, wherein the heat absorbing power generating means operates on the Rankine cycle with a receiver at the focal point concentrating the heat of insolation into a boiler to pressurize a working fluid for power generation, and wherein the said substrate has fins carrying heat radiating coils transportion expended working fluid to be cooled for recycling to said boiler.

14. The fixed position solar concentrator and power generator as set forth in any one of claims 4, 5 or 6, wherein the light sensitive power generating means is a battery of photo cells carried by a substrate at the collector plane for power generation, and wherein the substrate is a parabolic reflector disposed on an axis within the look angle of a satelite, there being a micro wave feed means at the focus of the substrate reflector.

15. The fixed position solar concentrator-collector and co-generating generator as set forth in any one of claims 7, 8, 9, 10, 11, 12 or 13, wherein the substrate is a parabolic reflector disposed on an axis within the look angle of a satellite, there being a micro wave feed means at the focus of the substrate reflector.

16. The fixed position solar concentrator and power generator as set forth in any one of claims 4 or 5, wherein the light sensitive power generating means is a battery of photo voltaic cells carried by a substrate at the collector plane for power generation, wherein the substrate is a parabolic reflector disposed on an axis within the look angle of a satelite, there being a micro wave feed means at the focus of the substrate reflector, and wherein the plane of the hologram window is angularly disposed to the said look angle axis and at an angular elevation of the suns traverse distinct therefrom.

17. The fixed position solar concentrator and power engerator as set forth in any one of claims 6 or 7, wherein the light sensitive power generating means is a battery of photo voltaic cells carried by a substrate at the collector plane for power generation, wherein the substrate is a parabolic reflector disposed on an axis within the look angle of a satelite, there being a micro wave feed means at the focus of the substrate reflector, and wherein the planes of the hologram windows are angularly disposed to the said look angle axis and at an angular elevation of the suns traverse distinct therefrom.

18. The fixed position solar concentrator-collector and co-generating generator as set forth in any one of claims 7, 8, 9, 10, 11, 12 or 13, wherein the substrate is a parabolic reflector disposed on an axis within the look angle of a satelite, there being a micro wave feed means at the focus of the substrate reflector, and wherein the planes of the hologram windows are angularly disposed to the said look angle axis and at an angular elevation of the suns traverse distinct therefrom.

* * * * *

UNITED STATES PATENT AND TRADEMARK OFFICE
CERTIFICATE OF CORRECTION

PATENT NO. : 4,490,981

DATED : Jan. 1, 1985

INVENTOR(S) : MILTON MECKLER

It is certified that error appears in the above-identified patent and that said Letters Patent is hereby corrected as shown below:

COVER PAGE TITLE:
Change "SATELITE" to -- SATELLITE --.

Col. 1 line 2 change "SATELITE" to -- SATELLITE --; line 33 change "descrete" to -- discrete --; Col. 3 line 58 change "satelite" to -- satellite --, Col. 4 lines 19, 25, 31, 53 and 66 change "satelite" to -- satellite --; line 26 change "coolector" to --collector --; line 52 change "azimust" to -- azimuth --; Col. 5 lines 1, 31-32 and 68 change "satelite" to --satellite--; line 20 change "rectifyer" to -- rectifier --; Col. 7 lines 23 and 47 change "satelite" to -- satellite --.

IN THE CLAIMS:
Col. 8 lines 2-3, 5, 14, 28, 39, 55-56, 61, 66 change "descrete" to -- discrete --; line 56 change "sulight" to -- sunlight --. Col. 10 line 13 change "transportion" to -- transporting --; lines 21, 35, 46 and 56 change "satelite" to -- satellite --; line 41 change "engerator" to -- generator --.

Signed and Sealed this

Twelfth Day of May, 1992

Attest:

DOUGLAS B. COMER

Attesting Officer

Acting Commissioner of Patents and Trademarks